United States Patent
Schmidt et al.

(10) Patent No.: US 10,185,789 B2
(45) Date of Patent: Jan. 22, 2019

(54) TECHNIQUES FOR MODELING ELASTIC RODS IN POSITION-BASED DYNAMICS FRAMEWORKS

(71) Applicant: AUTODESK, INC., San Rafael, CA (US)

(72) Inventors: Ryan Michael Schmidt, Toronto (CA); Nobuyuki Umetani, Zurich (CH); Jos Stam, Toronto (CA)

(73) Assignee: AUTODESK, INC., San Rafael, CA (US)

( * ) Notice: Subject to any disclaimer, the term of this patent is extended or adjusted under 35 U.S.C. 154(b) by 1056 days.

(21) Appl. No.: 14/544,157

(22) Filed: Dec. 2, 2014

(65) Prior Publication Data

US 2016/0154906 A1  Jun. 2, 2016
US 2017/0169136 A9  Jun. 15, 2017

Related U.S. Application Data

(60) Provisional application No. 61/911,303, filed on Dec. 3, 2013.

(51) Int. Cl.
| | |
|---|---|
| *G06F 7/60* | (2006.01) |
| *G06F 17/10* | (2006.01) |
| *G06F 17/50* | (2006.01) |
| *G06F 17/16* | (2006.01) |
| *A63F 13/57* | (2014.01) |

(52) U.S. Cl.
CPC ......... *G06F 17/5009* (2013.01); *G06F 17/16* (2013.01); *A63F 13/57* (2014.09)

(58) Field of Classification Search
CPC .................................. G06F 17/5009

USPC ............................................. 703/2
See application file for complete search history.

(56) References Cited

U.S. PATENT DOCUMENTS

| | | | |
|---|---|---|---|
| 9,070,221 B1 * | 6/2015 | Soares | G06T 13/40 |
| 9,449,417 B1 * | 9/2016 | Iben | G06T 13/40 |

(Continued)

OTHER PUBLICATIONS

Antman S. S.: Nonlinear problems of elasticity, vol. 107. Springer, 2005.

(Continued)

*Primary Examiner* — Timothy A Mudrick
(74) *Attorney, Agent, or Firm* — Artegis Law Group, LLP (57) ABSTRACT

In one embodiment of the present invention, a position-based dynamics (PBD) framework provides realistic modeling and simulation for elastic rods. In particular, the twisting and bending physics of elastic rods is incorporated into the PBD framework. In operation, an elastic rod model generator represents the center line of an elastic rod as a polyline of points connected via edges. For each edge, the elastic rod model generator adds a ghost point to define the orientation of a material frame that encodes the twist of the edge. Subsequently, a PBD simulator solves for positions of both points and ghost points that, together, represent the evolving position and torsion of the elastic rod. Advantageously, the ghost points enable more realistic animation of deformable objects (e.g., curly hair) than conventional PBD frameworks. Further, unlike force based methods, elastic rod simulation in the PBD framework performs acceptably in environments where speed is critical.

20 Claims, 6 Drawing Sheets
(3 of 6 Drawing Sheet(s) Filed in Color)

(56) References Cited

U.S. PATENT DOCUMENTS

| | | | | |
|---|---|---|---|---|
| 2010/0277475 | A1* | 11/2010 | McAdams | G06T 13/40 345/420 |
| 2010/0299106 | A1* | 11/2010 | Audoly | G06T 13/40 703/1 |
| 2011/0216070 | A1* | 9/2011 | Witkin | G06T 13/40 345/442 |
| 2011/0216074 | A1* | 9/2011 | Witkin | G06T 13/40 345/473 |

OTHER PUBLICATIONS

Bertails F., Audoly B., Cani M.-P., Querleux B., Leroy F., Lévêque J.-L.: Super-helices for predicting the dynamics of natural hair. ACM Trans. Graph. 25,3 (Jul. 2006), 1180-1187.

Bergou M., Audoly B., Vouga E., Wardetzky M., Grinspun E.: Discrete viscous threads. ACM Trans. Graph. 29,4 (Jul. 2010), 116:1-116:10.

Bender J., Müller M., Otaduy M. A., Teschner M.: Position-based methods for the simulation of solid objects in computer graphics. In EUROGRAPHICS 2013 State of the Art Reports (2013), Eurographics Association.

Bergou M., Wardetzky M., Robinson S., Audoly B., Grinspun E.: Discrete elastic rods. ACM Trans. Graph. 27,3 (Aug. 2008), 63:1-63:12.

Casati R., Bertails-Descoubes F.: Super space clothoids. ACM Trans. Graph. 32,4 (Jul. 2013), 48:1-48:12.

Jakobsen T.: Advanced character physics. In Game Developers Conference (2001), pp. 383-401.

Kaldor J. M., James D. L., Marschner S.: Efficient yam-based cloth with adaptive contact linearization. ACM Trans. Graph. 29,4 (Jul. 2010), 105:1-105:10.

Müller M., Chentanez N.: Solid simulation with oriented particles. ACM Trans. Graph. 30,4 (Jul. 2011), 92:1-32:10.

Müller M., Heidelberger B., Teschner M., Gross M.: Meshless deformations based on shape matching. ACM Trans. Graph. 24,3 (Jul. 2005), 471-478.

Macklin M., Müller M.: Position based fluids. ACM Trans. Graph. 32,4 (Jul. 2013), 104:1-104:12.

Pai D. K.: Strands: Interactive simulation of thin solids using cosserat models. Comput. Graph. Forum 21, 3 (2002), 347-352.

Rivers A. R., James D. L.: Fastlsm: fast lattice shape matching for robust real-time deformation. ACM Trans. Graph. 26, 3 (Jul. 2007).

Selle A., Lentine M., Fedkiw R.: A mass spring model for hair simulation. ACM Trans. Graph. 27, 3 (Aug. 2008), 64:1-64:11.

Spillmann J., Teschner M.: Corde: Cosserat rod elements for the dynamic simulation of one-dimensional elastic objects. In Proceedings of the 2007 ACM SIGGRAPH/Eurographics symposium on Computer animation (Aire-la-Ville, Switzerland, Switzerland, 2007), SCA '07, Eurographics Association, pp. 63-72.

Stam J.: Nucleus: Towards a unified dynamics solver for computer graphics. In Computer-Aided Design and Computer Graphics, 2009. CAD/Graphics '09. 11th IEEE International Conference on (2009), pp. 1-11.

* cited by examiner

TECHNIQUES FOR MODELING ELASTIC RODS IN POSITION-BASED DYNAMICS FRAMEWORKS

CROSS-REFERENCE TO RELATED APPLICATIONS

This application claims benefit of the U.S. Provisional Patent Application having Ser. No. 61/911,303 and filed on Dec. 3, 2013. This related application is hereby incorporated herein by reference.

BACKGROUND OF THE INVENTION

Field of the Invention

Embodiments of the present invention relate generally to computer science and, more specifically, to techniques for modelling elastic rods in position-based dynamics frameworks.

Description of the Related Art

Generating realistic simulation results in real-time is essential for animating three-dimensional objects in time-sensitive animation applications, such as game engines. Position-based dynamics (PBD) frameworks are well-suited to many such animation applications. Notably, PBD frameworks employ techniques that sacrifice some quantitative accuracy to generate visually plausible results in real-time. For example, in PBD frameworks, all deformations of objects are characterized with discrete positions of points.

While the tradeoffs exhibited by PBD frameworks are often acceptable, some types of animation are not adequately represented in PBD frameworks. In particular, because PBD frameworks specify positions but not angles, PBD frameworks are typically unable to simulate complex bending and twisting of objects modeled as rods. Such a restriction limits the applicability of PBD frameworks to animation. For example, while PBD frameworks successfully animate much of a human body, PBD frameworks are typically unable to realistically simulate the twisting of curly hair.

Accordingly, elastic rods are commonly simulated using force-based methods, such as the finite element method, that are not optimized to represent deformations as only positions. While such force-based methods are capable of effectively emulating the natural motion of curly hair, the time required to simulate the thousands of hair strands included in a typical head of hair using force-based methods is prohibitive and unsuitable for animation-oriented applications.

As the foregoing illustrates, what is needed in the art are more effective techniques for simulating bending and twisting of elastic rods.

SUMMARY OF THE INVENTION

One embodiment of the present invention sets forth a computer-implemented method for simulating an elastic rod in a graphics application. The method includes generating a polyline that represents a center line associated with the elastic rod as a series of edges and points; for each edge of the polyline, associating a ghost point with the edge, where the ghost point has coordinates that define an orientation of a material frame that encodes a torsion associated with the edge; and computing new positions of the points and the ghost points after a time interval.

One advantage of the disclosed elastic rod modelling techniques is that these techniques enable the real-time simulation of bending and twisting behavior of elements modelled as rods, such as strands of hair. In particular, simulations may be performed in a position-based dynamics environment, coupling the efficiency inherent in such environments with the realistic modeling of torsion.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. The patent or application file contains at least one drawing executed in color. Copies of this patent or patent application publication with color drawing(s) will be provided by the Office upon request and payment of the necessary fee.

DETAILED DESCRIPTION

In the following description, numerous specific details are set forth to provide a more thorough understanding of the present invention. However, it will be apparent to one of skilled in the art that the present invention may be practiced without one or more of these specific details.

System Overview

Figure 1:
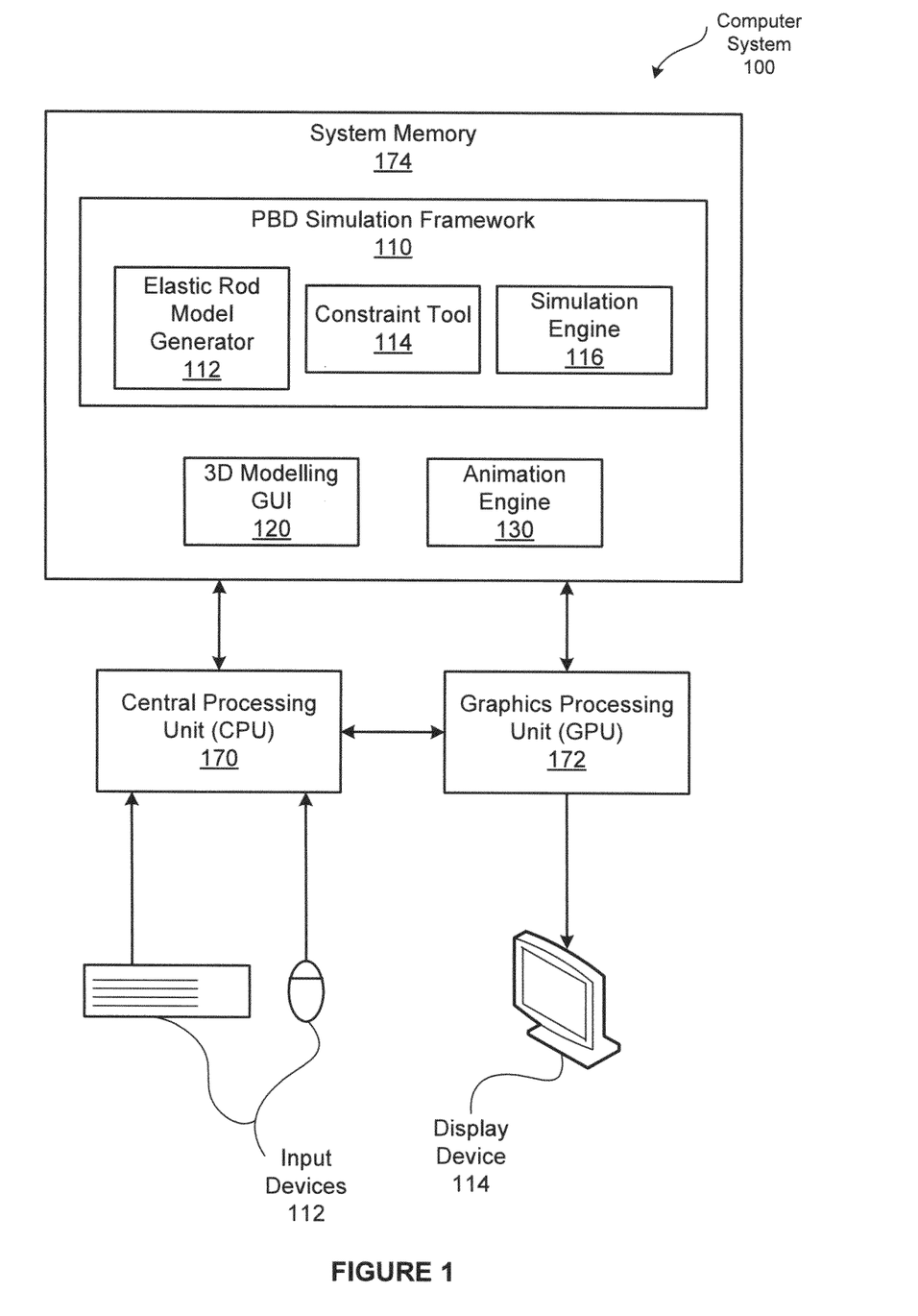
FIG. 1 is a block diagram illustrating a computer system configured to implement one or more aspects of the present invention.

FIG. 1 is a block diagram illustrating a computer system 100 configured to implement one or more aspects of the present invention. As shown, the computer system 100 includes, without limitation, a central processing unit (CPU) 170, a system memory 174, a graphics processing unit (GPU) 172, input devices 112, and a display device 114.

The CPU 170 receives input user information from the input devices 112, such as a keyboard or a mouse. In operation, the CPU 170 is the master processor of the computer system 100, controlling and coordinating operations of other system components. In particular, the CPU 170 issues commands that control the operation of the GPU 172. The GPU 172 incorporates circuitry optimized for graphics and video processing, including, for example, video output circuitry. The GPU 172 delivers pixels to the display device 114 that may be any conventional cathode ray tube, liquid crystal display, light-emitting diode display, or the like. In various embodiments, GPU 172 may be integrated with one or more of other elements of FIG. 1 to form a single system. For example, the GPU 172 may be integrated with the CPU 170 and other connection circuitry on a single chip to form a system on chip (SoC).

The system memory 174 stores content, such as software applications and data, for use by the CPU 170 and the GPU 172. As shown, the system memory 174 includes a 3D modelling graphical user interface (GUI) 120, a position-based dynamics (PBD) simulation framework 110, and an animation engine 130. The 3D modelling GUI 120, the PBD simulation framework 110, and the animation engine 130 are software applications that execute on the CPU 170, the GPU 172, or any combination of the CPU 170 and the GPU 172.

In operation, the 3D modelling GUI 120 enables specification and modification of a 3D model that describes a 3D object. The 3D modelling GUI 120 may be implemented in any technically feasible fashion and include a variety of functionality. For instance, the 3D modelling GUI 120 may include an interface that converts designer input such as symbols and brush stroke operations to geometries in the 3D model coupled to computer aided design (CAD) software that provides interactive feedback. Alternatively the 3D model GUI 120 may be configured to receive the 3D model via a 3D scanner that analyzes an existing 3D solid object to create the 3D model as a digital template.

The 3D model may conform to any 3D format as known in the art. For instance, in some embodiments the 3D model may capture unit normal and vertices that define the 3D solid object in the stereolithograpy format. In alternate embodiments, the 3D model may capture a 3D mesh of interconnected triangles that define the 3D solid object in the collaborative design activity (COLLADA) format. In alternate embodiments, the 3D model is created manually and the 3D modelling GUI 120 is not included in the computer system 100.

The 3D modelling GUI 120 is configured to receive designer input information from the input devices 112. After the 3D modelling GUI 120 processes the designer input information in conjunction with the 3D model, the 3D modelling GUI 120 delivers pixels to the display device 114. The 3D modelling GUI 20 is configured to continuously repeat this cycle, enabling the designer to dynamically interact with the 3D model based on real-time images on the display device 110.

The 3D modelling GUI 120 is coupled to the PBD simulation framework 110. This coupling may be implemented in any technically feasible fashion, such as exporting the 3D model from the 3D modelling GUI 20 and then importing the 3D model to the PBD simulation framework 120.

The PBD simulation framework 110 enables simulation of 3D models. Notably, the PBD simulation framework 110 implements position-based simulation techniques to efficiently simulate movement of 3D models for time-sensitive applications such as movies, computer games, etc. As shown, the PBD simulation framework 110 includes an elastic rod model generator 112, a constraint tool 114, and a simulation engine 116. To optimize performance within the PBD simulation framework 110, the shape and associated deformations of a 3D model are specified as discrete position of points. Consequently, conventional PBD simulation frameworks are unable to represent twisting of the 3D model (directly described with angular information as opposed to positional information).

For this reason, the PBD simulation framework 110 includes the elastic rod model generator 112. The elastic rod model generator 112 describes twist around the center line of a 3D model indirectly—using positional information to encode the angular information. While the PBD simulation framework 110 includes features that extend and optimize the processing of 3D models to enable realistic bending and twisting of elastic rods, the PBD simulation framework 110 leverages and extends many existing PBD processes, such as time-integration, collision, and constraint handling.

In particular, the constraint tool 114 formulates elasticity via constraints. The values of these constraints are zero for the rest shape of the 3D object and increase as strain is applied. At each time step, the simulation engine 116 updates the affected positional information in the gradient direction of the constraint, representing the internal force attempting to restore the 3D object to the rest shape. In general, the constraint tool 114 and the simulation engine 116 implement heuristics that mimic the real-world behavior of objects, such as the bending and twisting a rod.

The system memory 174 also includes an animation engine 130 that leverages the PBD simulation framework 110 to represent real-time motion of 3D objects. In alternate embodiments, the system memory 174 may include any number of applications that exploit features included in the PBD simulation framework 110.

In alternate embodiments, the 3D modelling GUI 120, the PBD simulation framework 110, and/or the animation engine 130 are integrated into any number (including one) of software applications. In other embodiments, the system memory 174 may not include the 3D modelling GUI 120 and/or the animation engine 130. In some embodiments, the 3D modelling GUI 120, the PBD simulation framework 110, and/or the animation engine 130 may be provided as an application program (or programs) stored on computer readable media such as a CD-ROM, DVD-ROM, flash memory module, or other tangible storage media.

The components illustrated in the computer system 100 may be included in any type of computer system 100, e.g., desktop computers, server computers, laptop computers, tablet computers, and the like. Additionally, software applications illustrated in computer system 100 may execute on distributed systems communicating over computer networks including local area networks or large, wide area networks, such as the Internet. Notably, the elastic rod model generator 112 described herein is not limited to any particular computing system and may be adapted to take advantage of new computing systems as they become available.

It will be appreciated that the computer system 100 shown herein is illustrative and that variations and modifications are possible. The number of CPUs 170, the number of GPUs 172, the number of system memories 174, and the number of applications included in the system memory 174 may be modified as desired. Further, the connection topology between the various units in FIG. 1 may be modified as desired.

Modelling Elastic Rods

Figure 2:
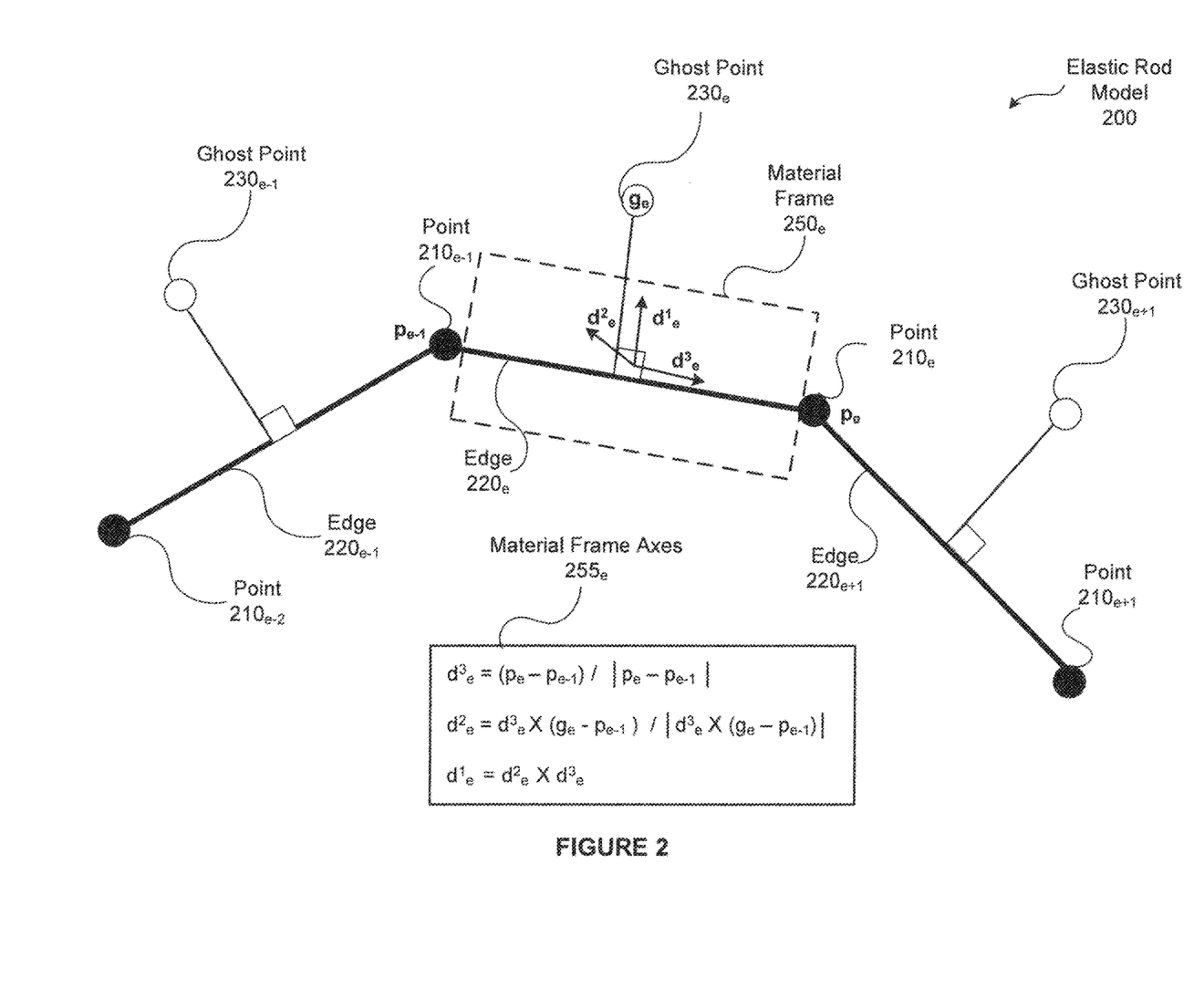
FIG. 2 is a conceptual diagram of an elastic rod model generated and maintained within the position-based dynamics (PBD) simulation framework of FIG. 1, according to embodiments of the present invention.

FIG. 2 is a conceptual diagram of an elastic rod model 200 generated and maintained within the position-based dynamics (PBD) simulation framework 110 of FIG. 1, according to embodiments of the present invention. In conventional PBD simulation frameworks, the center line of a rod is represented by a 3D polyline that can model such behaviors as bending and stretching, but is unable to represent torsion. To handle torsion, the PBD simulation framework 110 uses material frames 250 that are defined on the center line on the elastic rod model 200 and track the motion of the center line over time.

For each material frame 250 at a point on the center line, torsion is represented as the angle between the current orientation of the material frame 250 and the orientation of the material frame 250 when the rod is at rest (i.e., an untwisted state of zero energy). Since the PBD simulation framework 110 does not allow direct specification of angular information, the elastic rod model generator 112 is configured to represent the angular information that defines the orientation of the material frames 250 indirectly. More specifically, the elastic rod model generator 112 encodes the orientation of the material frames 250 via positional information of ghost points 230. Conceptually, the ghost points 230 represent material distributed around the center line.

In operation, the elastic rod model generator 112 initially creates a 3D polyline that represents the center line of the elastic rod. As shown, the 3D polyline of the elastic rod model 200 includes (N+1) points and N edges 220. The points 210 represent the end points of the interconnected line segments, and the edges 220 represent the line segments.

After establishing the 3D polyline, the elastic rod model generator 112 adds N ghost points 230 to the 3D polyline. Notably, for each of the N edges 220, the elastic rod model generator 112 adds the ghost point 230 that defines the material frame 250 for the line segment corresponding to the edge 220. In general, the elastic rod model generator 112 places each of the ghost points 230 on a perpendicular bisector of the corresponding edge 220. The angle of the perpendicular bisector encodes the twist about the center line relative to the rest state, and the distance along the perpendicular bisector reflects the rotational inertia around the corresponding edge 220.

As shown for material frame $250_e$, each material frame 250 is defined based on an orthonormal material bases $d^1$, $d^2$, $d^3$. The material frame 250 is a three-by-three orthonormal matrix $D=|d^1, d^2, d^3|$ that includes the orthonormal material bases as columns. The material frame axes $255_e$ depicts the calculation of the material frame 250 based on the associated ghost point $230_e$ and the points $210_{e-1}$ and $_{210e}$. Using interpolation techniques in conjunction with the discrete points 210 and ghost points 230, components within the PBD framework 110 efficiently access both the orientation of the material frames 250 and the resistance of the elastic rod to twisting in a continuous fashion across the length of the elastic rod.

Figure 3:
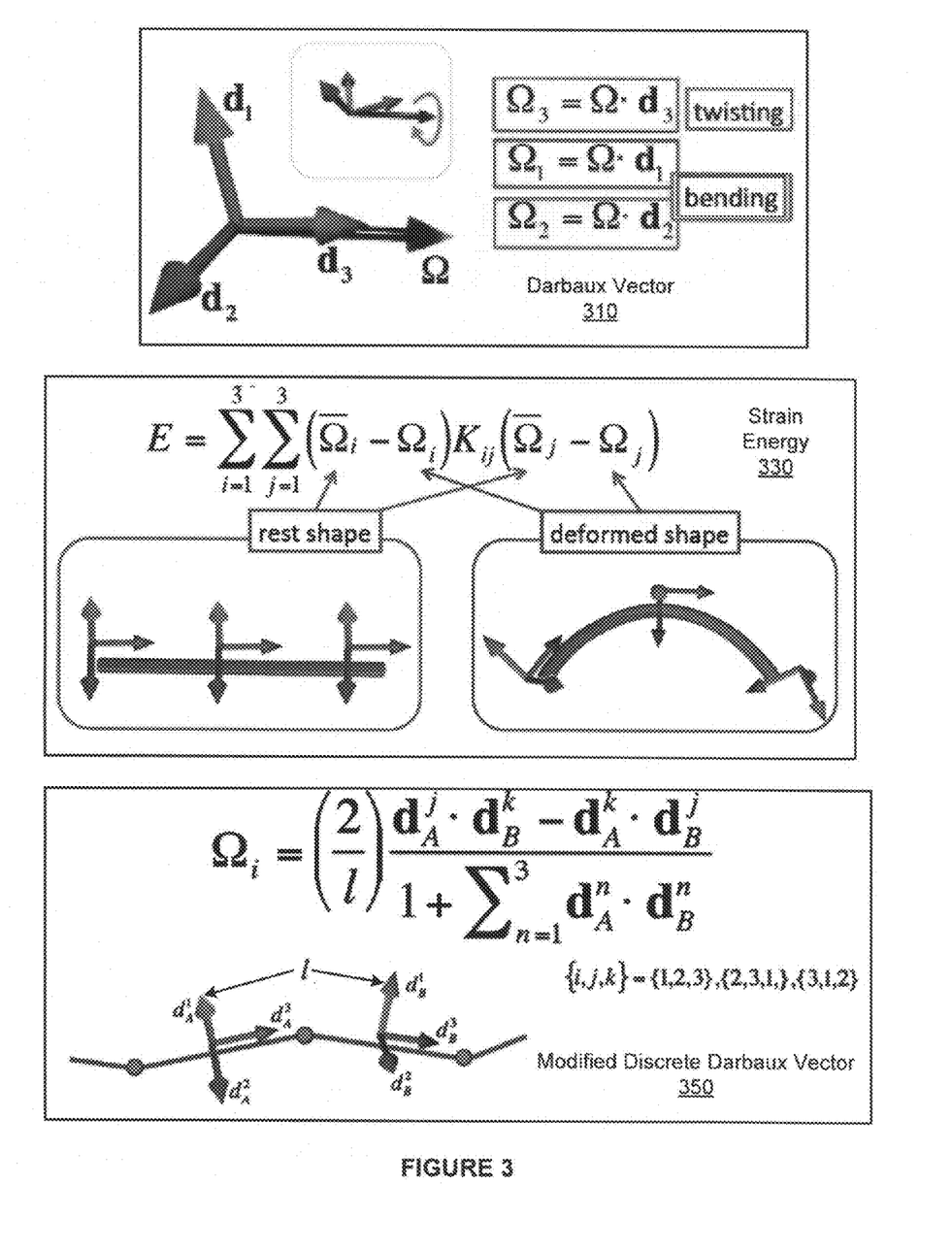
FIG. 3 depicts a modified discrete Darboux vector implemented within the position-based dynamics (PBD) simulation framework of FIG. 1, according to one embodiment of the present invention.

FIG. 3 depicts a modified discrete Darboux vector 350 implemented within the position-based dynamics (PBD) simulation framework 110 of FIG. 1, according to one embodiment of the present invention.

In general, the simulation engine 116 models bending and twisting of the elastic rod model 200 using a discretization of Cosserat theory. Cosserat theory describes the bending and twisting energy of a rod from the rate-of-change of the material frame 250. Accordingly, a key component of Cosserat theory is the Darboux vector 310—an axial vector of frame rotation with respect to position along the rod that is defined using the bases of the material frames 250.

In Cosserat theory, the strain energy 330 is the Darboux vector difference between the deformed shape and the rest shape of a rod. To increase both the speed and robustness of the energy calculations, instead of implementing Cosserat formulas based on the conventional Darboux vector 350, the simulation engine 116 substitutes a modified discrete Darboux vector 350. As shown, the modified discrete Darboux vector 350 is a relative simple formula that does not use trigonometry. Advantageously, the modified discrete Darboux vector 350 enables the simulation engine 116 to apply the discretization of Cosserat theory without computing relatively expensive trigonometric functions.

In various embodiments, the PBD framework 110 may implement any type equations to simulate motion based on the elastic rod model 200. Further, components within the PBD framework 110 may simplify and/or discretize formulas to optimize performance in any technically feasible manner.

Figure 4:
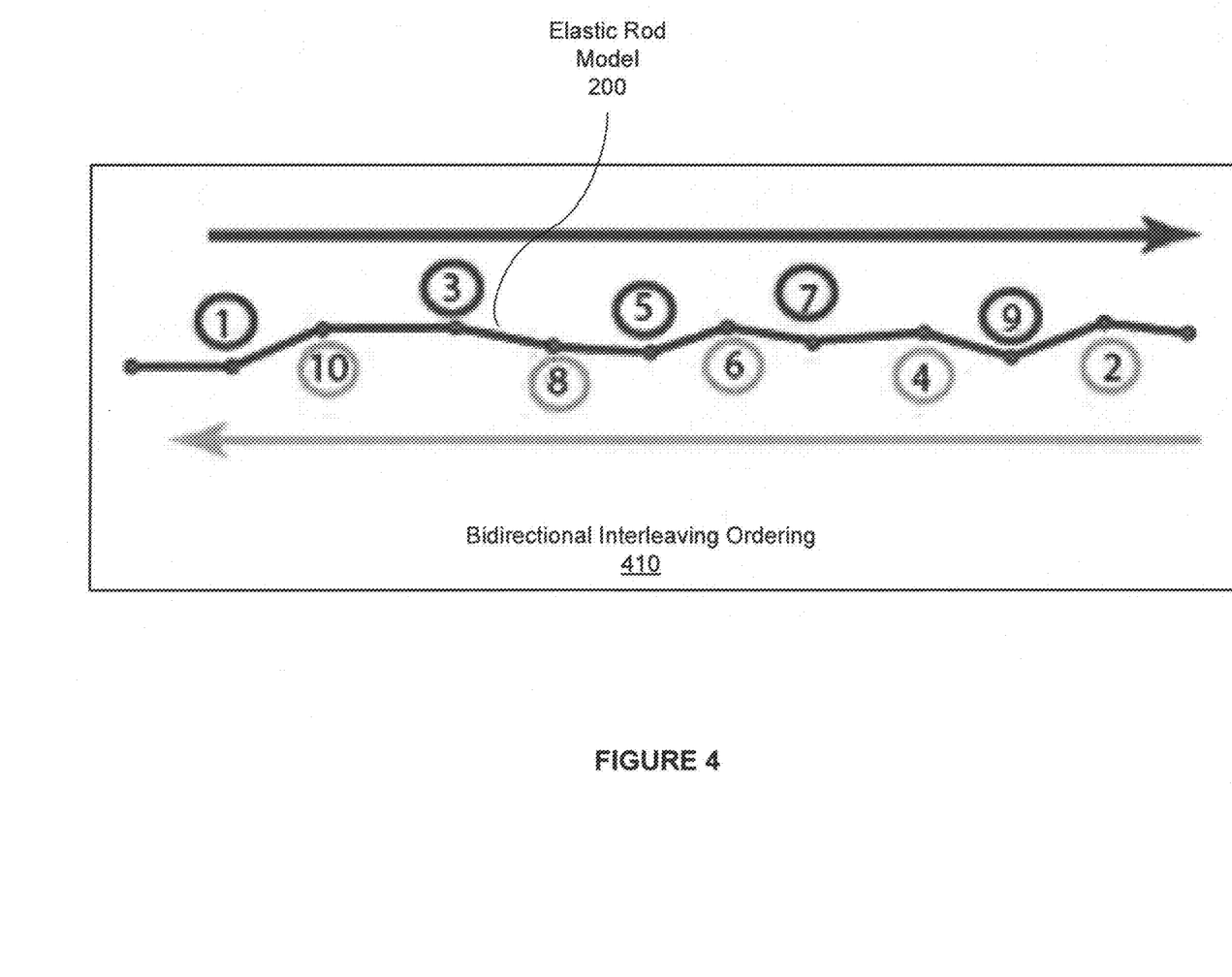
FIG. 4 is a conceptual illustration of a bilateral interleaving ordering enforced by the constraint tool of FIG. 1, according to one embodiment of the present invention.

FIG. 4 is a conceptual illustration of a bidirectional interleaving ordering 410 enforced by the constraint tool 114 of FIG. 1, according to one embodiment of the present invention. As part of representing and simulating the elastic rod model 200, the PBD simulation framework 110 handles elasticity in the form of constraints, such as coupling between a point 210, a material frame 250, a triangle, and/or a rigid body.

In general, the simulation engine 116 iteratively updates the locations of the points 210 and the ghost points 230 such that linearized constraints are locally satisfied. In the PBD simulation framework 110, the simulation engine 116 enforces each constraint in the form of an internal force. Enforcing the twist constraint of the elastic rod model 220 in the conventional sequential order is similar to an elastic wave propagating inside the elastic rod. The elastic rod has many harmonic vibration modes where the elastic wave goes back and force in the strand, and the sequential constraint enforcement may excite such vibrations.

For this reason, the constraint tool 114 configures the simulation engine 116 to apply the constraints based on the bidirectional interleaving order 410. As shown, the constraint tool 114 interleaves the constraints for both directions of the elastic rod model 200. Advantageously, applying constraints simultaneously from two directions cancels the vibration modes, producing stable results without excessive energy gain.

Figure 5:
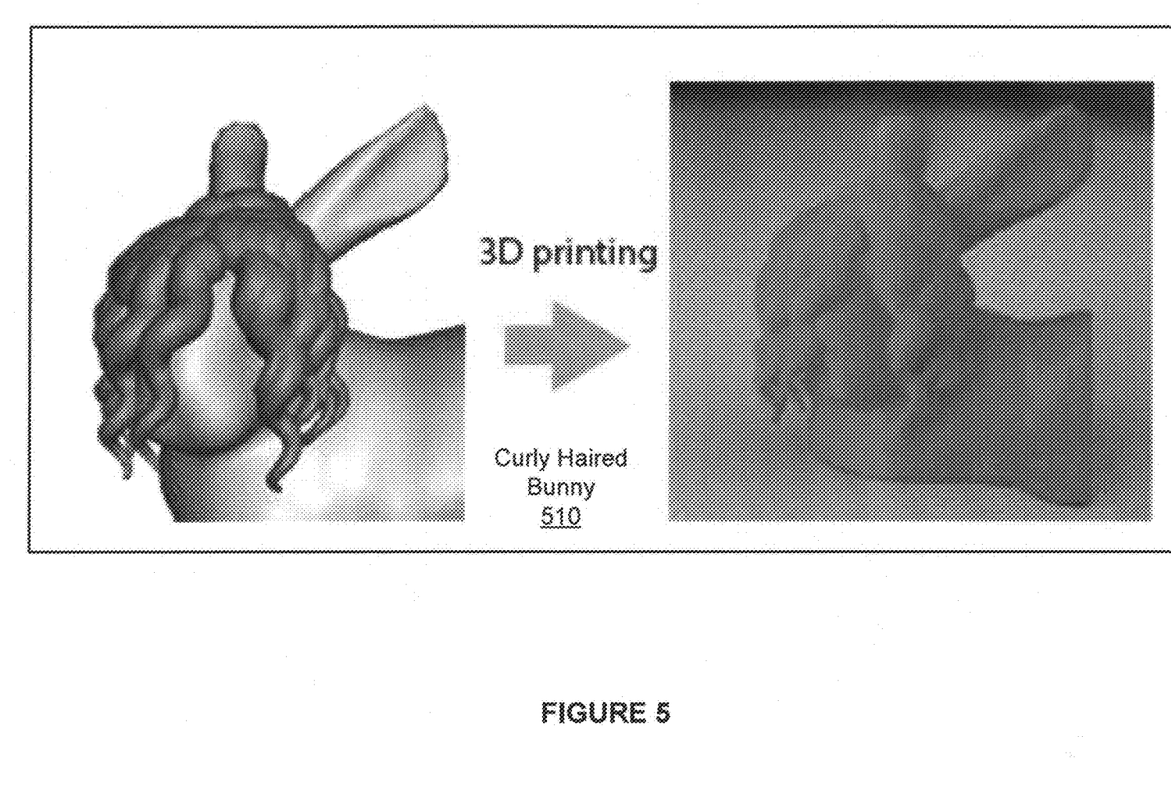
FIG. 5 is a conceptual diagram of a curly haired bunny that is based on a 3D model in which the hair strands are represented using the elastic rod model of FIG. 2, according to one embodiment of the present invention.

FIG. 5 is a conceptual diagram of a curly haired bunny 510 that is based on a 3D model in which the hair strands are represented using the elastic rod model 200 of FIG. 2, according to one embodiment of the present invention.

Because the PBD simulation framework 100 is both efficient and robust, the PBD framework 110 may be used to provide advanced functionality in a variety of interactive tools. In some embodiments, the 3D modelling GUI 120 includes functionality that enables the user to create hair volumes. In particular, the 3D modelling GUI 120 provides mechanisms to interactive manipulate parameters of the hair, such as twisting and scaling individual strands. This hair design functionality may also be extended to create solid hair for 3D printing purposes. For explanatory purposes, FIG. 5 illustrates the model of the curly haired bunny 510 designed and simulated in the PBD simulation framework 100, and the resulting 3D-printed bunny object.

Since there are thousands of hairs on a typical scalp, without the efficiency exhibited by the PBD simulation framework 100, such constructive interactive design would be prohibitively slow. For example, the complex calculations employed by finite element methods require unreasonable amounts of time for time-sensitive applications. Further, because of the high number of PBD-based calculations necessary to realistically simulate 3D objects, manual approaches are unable to produce useful real-time results.

Figure 6:
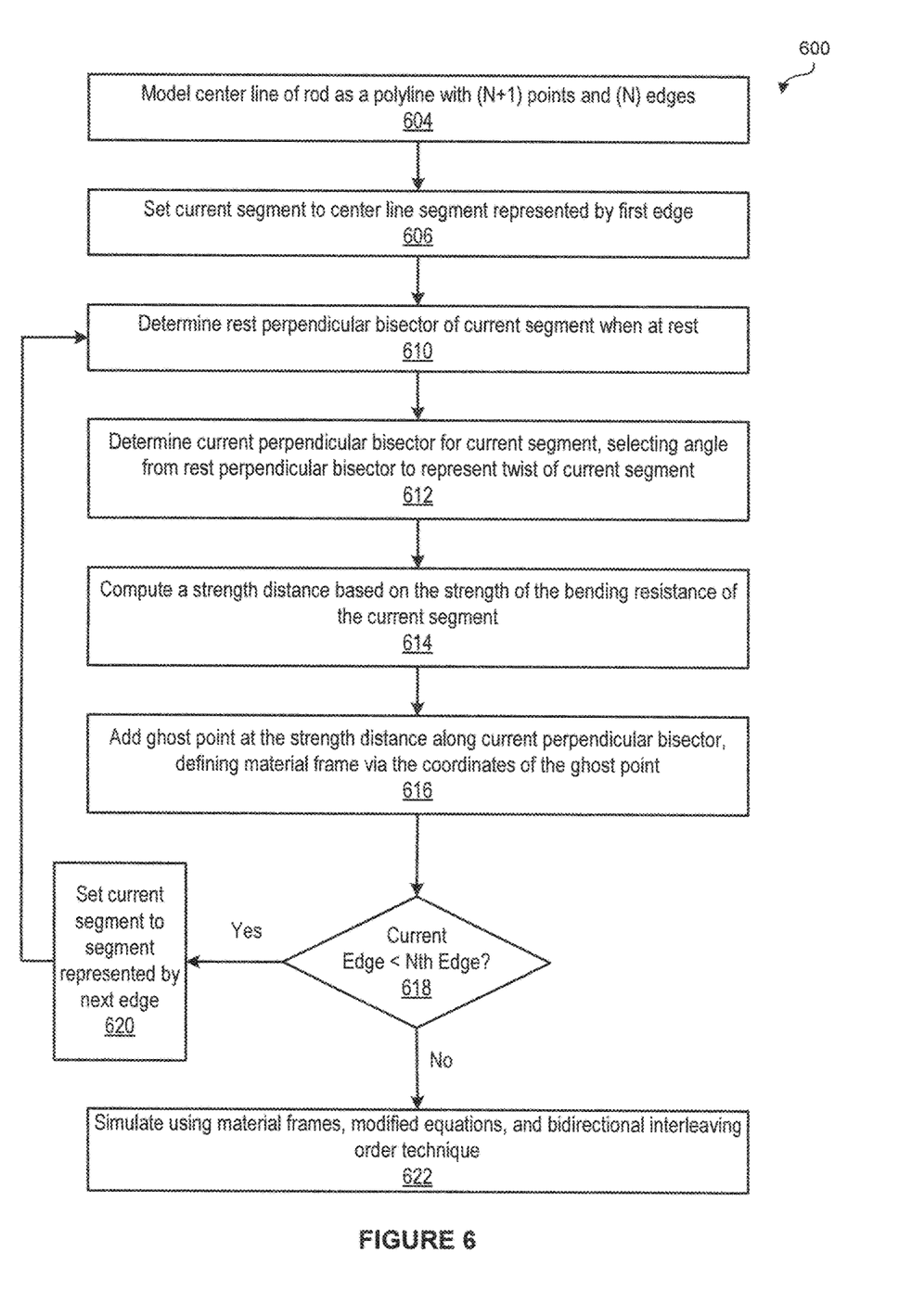
FIG. 6 is a flow diagram of method steps for establishing a position-based dynamics simulation (PBD) framework that supports elastic rod modeling, according to one embodiment of the present invention.

FIG. 6 is a flow diagram of method steps for establishing a position-based dynamics simulation (PBD) framework that supports elastic rods modelling, according to one embodiment of the present invention. Although the method steps are described with reference to the systems of FIGS. 1-5, persons skilled in the art will understand that any system configured to implement the method steps, in any order, falls within the scope of the present invention.

As shown, a method 600 begins at step 604, where the elastic rod model generator 112 initializes the elastic rod model 200 for a rod. More specifically, the elastic rod model generator 112 creates a polyline that resents the center line of the rod and includes (N+1) points 210 and (N) edges 220. At step 606, the elastic rod model generator 112 sets a current segment to the portion of the center line segment that is represented by the first edge 220.

At step 610, the elastic rod model generator 112 determines a "rest" perpendicular bisector as the perpendicular bisector of the current line segment when the current segment is at rest (state of zero energy). The elastic rod model generator 112 may determine the rest perpendicular bisector in any technically feasible fashion that is consistent across the points 210 and the ghost points 230.

At step 612, the elastic rod model generator 112 computes a "current" perpendicular bisector of the current segment, encoding the twist of the current segment as the angle between the current perpendicular bisector and the rest perpendicular bisector. Notably, the elastic rod model generator 112 sets the current perpendicular bisector such that the cross product between the current edge 220 and the current perpendicular bisector represents the rotation of the current edge 220. In alternate embodiments, the elastic rod model generator 112 may encode the twist in any technically feasible and deterministic fashion.

At step 614, the elastic rod model generator 112 computes a strength distance based on the bending resistance of the current segment. The elastic rod model generator 112 may encode the bending resistance in any technically feasible and consistent manner. At step 616, the elastic rod model generator 112 determines the coordinates for the ghost point 200—setting the position to be the strength distance along the current perpendicular bisector. Notably, the current perpendicular bisector is one of the axes of the material frame 250. The elastic rod model generator 112 computes the remaining two axes as illustrated in the material frame axes 255 of FIG. 2. Advantageously, using the ghost point 200 to encode the strength and material frame for the current segment enables realistic modelling of torsion in the PBD simulation framework 110.

At step 618, if the elastic rod model generator 112 determines that the current edge 220 is not the last edge 220 included in the polyline, then the method 600 proceeds to step 620. At step 620, the elastic rod model generator 112 sets the current segment to the center line segment that is represented by the next edge 220, and the method 600 returns to step 610. The elastic rod model generator 112 continues to execute steps 610-618, encoding the material frame 250 for each edge 220 via the corresponding ghost point 230 until the elastic rod model 200 includes ghost points 230 for each of the edges 220.

If, at step 618, the elastic rod model generator 112 determines that the edge 220 is the last edge 220 included in the polyline, then the method 600 proceeds directly to step 622. At step 622 the elastic rod model generator 112 is complete and various components included in the PBD simulation framework 110 operate on the elastic rod model 200. Advantageously, the PBD simulation framework 110 analyzes the material frames 250 in conjunction with optimized simulation techniques such as applying the modified discrete Darboux vector 350 and enforcing bidirectional interleaving ordering 410 to increase the speed and robustness of the simulation.

In sum, the disclosed techniques may be used to efficiently model and simulate complex bending and twisting of elastic rods in position-based dynamics (PBD) frameworks. In operation, an elastic rod model generator partitions an elastic rod into segments that are represented by edges and connected at points. This polyline represents the physical location of the elastic rod and characterizes any bending and stretching, but not torsion. To represent torsion, the elastic rod model generator enhances the polyline—adding a "ghost" point per edge. Notably, the elastic rod model generator selects the location of each ghost point to define the orientation of a material frame that follows the tangential direction of the elastic rod. By encoding the orientation of the material frames in the coordinates of the ghost points, the twist about each edge is indirectly, but accurately, represented.

Advantageously, the position-based elastic modelling techniques disclosed herein enable realistic, real-time animation of objects that bend and twist. In particular, the insertion of ghost points enables plausible real-time simulation and rendering of curly hair. By contrast, conventional PBD frameworks are unable to represent the torsion in elastic rods, and therefore are unable to simulate phenomena such as naturally-behaving curly hair. Further, since the position-based elastic model leverages the efficiency of position-based dynamic, the elastic rod model and associated techniques may be successfully employed by time-critical applications, such as game engines.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for simulating an elastic rod in a graphics application, the method comprising:
   generating a polyline that represents a center line associated with the elastic rod as a series of edges and points;
   for each edge of the polyline connecting at least two of the points of the polyline, associating a ghost point with the edge, wherein the ghost point has coordinates that define an orientation of a material frame that encodes a torsion associated with the edge; and
   computing new positions of the points and the ghost points after a time interval.

2. The computer-implemented method of claim 1, wherein, for a first edge of the polyline, associating the ghost point comprises:
   defining a first perpendicular bisector of the first edge, wherein the first perpendicular bisector represents the first edge in a rest state;
   computing a second perpendicular bisector of the first edge at an angle to the first perpendicular bisector, wherein the angle corresponds to the torsion of the first edge; and
   setting the coordinates of the ghost point to specify the angle.

3. The computer-implemented method of claim 2, wherein, for a first edge of the polyline, adding the ghost point further comprises setting the distance of the ghost point from the first edge based on the strength of a bending resistance associated with a portion of the elastic rod corresponding to the first edge.

4. The computer-implemented method of claim 2, wherein establishing the second perpendicular bisector comprises computing a cross-product to determine a bisector.

5. The computer-implemented method of claim 1, wherein computing comprises:
   determining a first material frame based on a first ghost point and a second material frame based on a second ghost point, wherein both the first material frame and the second material frames track the motion of the center line over time; and
   determining a bending and twisting energy from a rate-of-change of the position of the center line between the first material frame and the second material frame.

6. The computer-implemented method of claim 5, wherein determining the bending and twisting energy comprises:
   calculating a Darboux vector by performing an interpolation between the first material frame and the second material frame; and
   applying the Darboux vector to determine the bending and twisting energy without computing any trigonometric functions.

7. The computer-implemented method of claim 1, wherein computing comprises applying one or more constraints in a bi-directional interleaving order.

8. The computer-implemented method of claim 7, wherein the one or more constraints include a coupling between a first point and one of a frame, a triangle, and a rigid body.

9. The computer-implemented method of claim 8, further comprising generating a three-dimensional model for three-dimensional printing based on the new positions of the points of the polyline.

10. A computer-readable storage medium including instructions that, when executed by a processing unit, cause the processing unit to simulate an elastic rod in a graphics application by performing the steps of:
    generating a polyline that represents a center line associated with the elastic rod as a series of edges and points;
    for each edge of the polyline connecting at least two of the points of the polyline, associating a ghost point with the edge, wherein the ghost point has coordinates that define an orientation of a material frame that encodes a torsion associated with the edge; and
    computing new positions of the points and the ghost points after a time interval.

11. The computer-readable storage medium of claim 10, wherein, for a first edge of the polyline, associating the ghost point comprises:
    defining a first perpendicular bisector of the first edge, wherein the first perpendicular bisector represents the first edge in a rest state;

computing a second perpendicular bisector of the first edge at an angle to the first perpendicular bisector, wherein the angle corresponds to the torsion of the first edge; and setting the coordinates of the ghost point to specify the angle.

12. The computer-readable storage medium of claim 11, wherein, for a first edge of the polyline, adding the ghost point further comprises setting the distance of the ghost point from the first edge based on the strength of a bending resistance associated with a portion of the elastic rod corresponding to the first edge.

13. The computer-readable storage medium of claim 11, wherein establishing the second perpendicular bisector comprises computing a cross-product to determine a bisector.

14. The computer-readable storage medium of claim 10, wherein computing comprises:

determining a first material frame based on a first ghost point and a second material frame based on a second ghost point, wherein both the first material frame and the second material frames track the motion of the center line over time; and determining a bending and twisting energy from a rate-of-change of the position of the center line between the first material frame and the second material frame.

15. The computer-readable storage medium of claim 14, wherein determining the bending and twisting energy comprises:

calculating a Darboux vector by performing an interpolation between the first material frame and the second material frame; and applying the Darboux vector to determine the bending and twisting energy without computing any trigonometric functions.

16. The computer-readable storage medium of claim 10, wherein computing comprises applying one or more constraints in a bi-directional interleaving order.

17. The computer-readable storage medium of claim 16, wherein the one or more constraints include a coupling between a first point and one of a frame, a triangle, and a rigid body.

18. The computer-readable storage medium of claim 17, further comprising generating a three-dimensional model for three-dimensional printing based on the new positions of the points of the polyline.

19. A system configured to simulate an elastic rod in a graphics application, the system comprising:

a processing unit configured to:

generate a polyline that represents a center line associated with the elastic rod as a series of edges and points;

for each edge of the polyline connecting at least two of the points of the polyline, associate a ghost point with the edge, wherein the ghost point has coordinates that define an orientation of a material frame that encodes a torsion associated with the edge; and compute new positions of the points and the ghost points after a time interval; and a display device coupled to the processing unit and configured to display the elastic rod.

20. The system of claim 19, wherein for a first edge of the polyline, associating the ghost point comprises:

defining a first perpendicular bisector of the first edge, wherein the first perpendicular bisector represents the first edge in a rest state;

computing a second perpendicular bisector of the first edge at an angle to the first perpendicular bisector, wherein the angle corresponds to the torsion of the first edge; and setting the coordinates of the ghost point to specify the angle.

* * * * *